United States Patent [19]
Chen et al.

[11] Patent Number: 5,545,574
[45] Date of Patent: Aug. 13, 1996

[54] PROCESS FOR FORMING A SEMICONDUCTOR DEVICE HAVING A METAL-SEMICONDUCTOR COMPOUND

[75] Inventors: Wei-Ming Chen; Shih-Wei Sun; Paul G. Y. Tsui, all of Austin, Tex.

[73] Assignee: Motorola, Inc., Schaumburg, Ill.

[21] Appl. No.: 444,980

[22] Filed: May 19, 1995

[51] Int. Cl.$^6$ .................................................. H01L 21/283
[52] U.S. Cl. ............................ 437/40; 437/41; 437/200; 437/241
[58] Field of Search .................................. 437/189, 200, 437/40 GS, 41 SM, 241; 257/384, 757

[56] References Cited

U.S. PATENT DOCUMENTS

| | | | |
|---|---|---|---|
| 4,080,719 | 3/1978 | Wilting | 437/200 |
| 4,784,973 | 11/1988 | Stevens et al. | 437/200 |
| 4,920,401 | 4/1990 | Sakai et al. | 357/59 |
| 4,922,319 | 5/1990 | Fukushima | 357/51 |
| 4,940,509 | 7/1990 | Tso et al. | 156/653 |
| 5,266,502 | 11/1993 | Okada et al. | 437/24 |
| 5,286,678 | 2/1994 | Rastogi | 437/200 |
| 5,382,533 | 1/1995 | Ahmad et al. | 437/24 |
| 5,397,744 | 3/1995 | Sumi et al. | 437/24 |

OTHER PUBLICATIONS

Choi, et al, "Formation and expitaxial growth of . . ." J. Crystal Growth, Dec. 1991, vol. 115, No. 1–4, pp. 579–588.

Chen, et al.; "A Novel CoSi2 Thin Film Process with Improved Thickness Scalability and Thermal Stability"; IEDM; pp. 691–694; (1994).

Horiuchi, et al.; "A New Titanium Salicide Process (DIET) for Sub–quarter Micron CMOS"; Symposium on VLSI Technology Digest of Technical Papers; pp. 121–122; (1994).

"Mitsubishi M5M416400BTP-7, 16-Meg DRAM;" Integrated Circuit Engineering Corporation; pp. 12 and 13 and Figures 1 and 29 (Jun. 1995).

"Intel A80502—120, Pentium Processor;" Integrated Circuit Engineering Corporation; pp. 11 and 12 and Figures 7, 31, and 46 (Jun. 1995).

Xiao, et al.; "Agglomeration of Cobalt Silicide Film;" Mat. Res. Symp. Proc. vol. 202; pp. 101–106 (1991).

Wolf, et al.; "Self–Aligned Silicide (Salicide) Technology;" Silicon Processing for VLSI Era—vol. 1; pp. 397–399 (1986).

Primary Examiner—T. N. Quach
Attorney, Agent, or Firm—George R. Meyer

[57] ABSTRACT

A metal-semiconductor compound (72, 74, 76) is formed after a step that introduces nitrogen into regions (52, 54, 56) of the device (100). In one embodiment, a nitrogen-containing gas is exposed to surfaces (42, 44, 46) before forming a titanium layer (62) is deposited. A one-step anneal is performed to form titanium disilicide regions (72, 72, 76) that are in the C54 phase without thermal agglomeration or forming electrical shorts between the titanium disilicide regions (72, 74, 76).

28 Claims, 3 Drawing Sheets

PROCESS FOR FORMING A SEMICONDUCTOR DEVICE HAVING A METAL-SEMICONDUCTOR COMPOUND

FIELD OF THE INVENTION

The present invention relates to semiconductor devices, and in particular, to semiconductor devices having metal-semiconductor compounds.

BACKGROUND OF THE INVENTION

Titanium disilicide ($TiSi_2$) has two phases that include a low-resistance phase C54 and a high-resistance phase C49. In semiconductor applications, the C54 phase is preferred because of its lower resistivity that generally results in faster operating parts. One method of forming the C54 phase of titanium disilicide includes depositing a titanium layer over an exposed silicon surface. The surface is typically first annealed at 600°–650 degrees Celsius (°C.) to form the C49 phase of titanium disilicide.

After unreacted portions of the titanium layer are removed, the substrate is annealed again at a temperature of at least 800° C. to form the low-resistive C54 phase of titanium disilicide. If the etch to remove the unreacted portions would not have been performed between the two thermal steps, a titanium disilicide region formed from part of a gate polysilicon layer may electrically short to a titanium disilicide region formed from part of an adjacent source or drain region.

Higher component densities require that regions become smaller and thicknesses become narrower and thinner. As the titanium layer becomes thinner, forming the C49 phase of titanium silicide and transforming the C49 phase into the C54 phase become more difficult. One problem is thermal agglomeration, which occurs when a titanium disilicide layer of relatively uniform thickness is converted to discrete islands of titanium disilicide. This results in a discontinuous titanium disilicide layer. Thermal agglomeration is more likely to occur as the titanium disilicide becomes thinner and as the width of source regions, drain regions, and gate electrodes become smaller. The electrical problems of thermal agglomeration include high resistivity due to a discontinuous titanium disilicide layer, high p-n junction leakage within source or drain regions, or lower gate oxide integrity for a titanium disilicide layer formed from a portion of a gate electrode.

A need exists to form a disilicide layer in the C54 phase using a single step without forming an electrical short. A need also exists to form a relatively thin silicide layer that does not have the problems of thermal agglomeration.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

SUMMARY OF THE INVENTION

A metal-semiconductor compound is formed by a process using a step that incorporates nitrogen into regions of the device before forming the metal-semiconductor compound. The process allows the metal-compound semiconductor to be formed with a reduced likelihood of thermal agglomeration or forming electrical shorts between adjacent regions. The present invention is better understood with the embodiments that are described below.

DESCRIPTION OF THE PREFERRED EMBODIMENTS

Semiconductor Device

Figure 1:
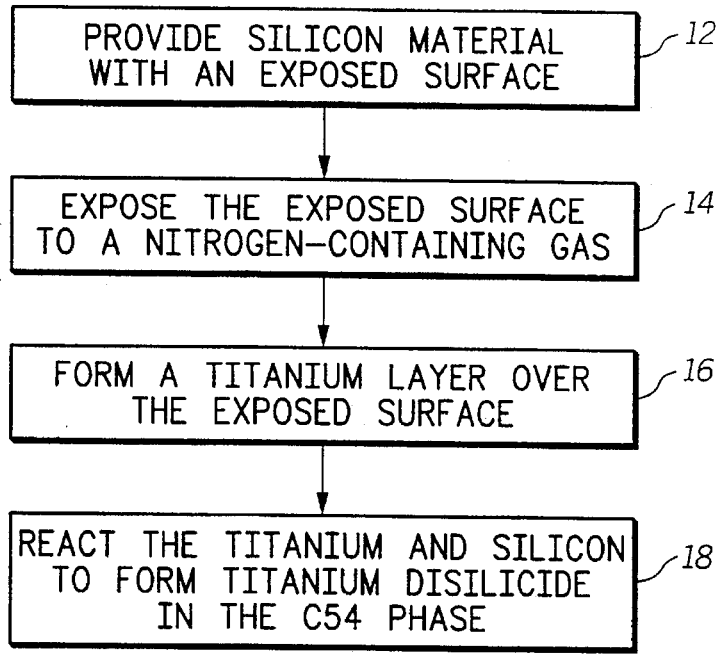
FIG. 1 includes a process flow diagram of an embodiment in accordance with the present invention.

FIG. 1 includes a process flow diagram of one embodiment of the present invention. A silicon material with an exposed surface is provided in step 12. The exposed surface is exposed to a nitrogen-containing gas in step 14. A titanium layer is formed over the exposed surface in step 16. The titanium and silicon are reacted to form titanium disilicide in the C54 phase in step 18. The paragraphs below include a description of an example of the process.

Figure 2:
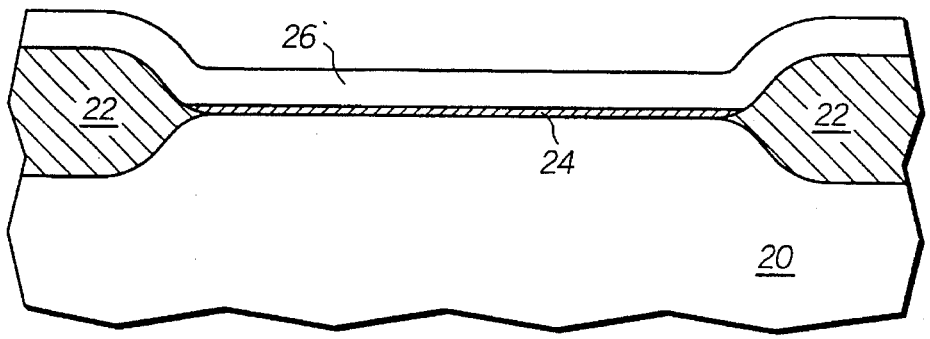
FIG. 2 includes an illustration of a cross-sectional view of a portion of a semiconductor substrate after forming a gate electrode layer.

FIG. 2 includes an illustration of a cross-sectional view of a portion of a semiconductor substrate 20. The semiconductor substrate 20 includes a p-type monocrystalline silicon wafer, although another material including germanium, silicon germanium, or silicon carbide could be used. As used in this specification, a substrate can include a well region within a semiconductor wafer or a semiconductor layer over an insulating base material (i.e., silicon on insulator). Field isolation regions 22 and a gate dielectric layer 24 overlie the substrate 20. A gate electrode layer 26 overlies the field isolation regions 22 and the gate dielectric layer 24. The gate dielectric layer 24 includes silicon dioxide, silicon nitride, or a nitrided oxide. The gate dielectric layer 24 is formed by thermal oxidation, chemical vapor deposition, or a combination thereof. The gate electrode layer 26 includes amorphous silicon, polycrystalline silicon (polysilicon), silicon germanium, or silicon carbide. In any event, the gate electrode layer 26 includes a semiconductor material.

Figure 3:
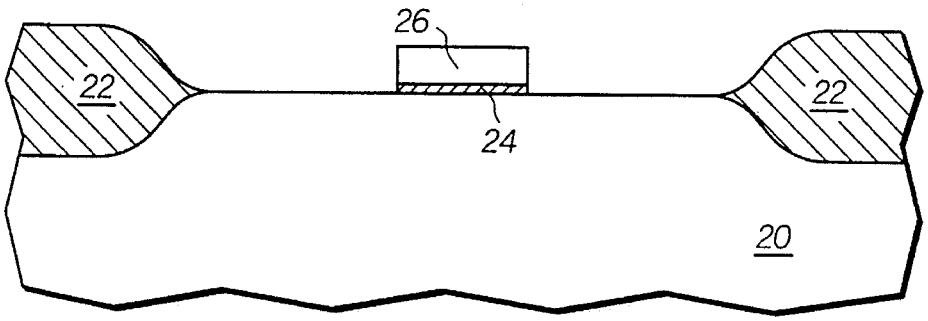
FIG. 3 includes an illustration of a cross-sectional view of the substrate of FIG. 2 after patterning the gate electrode layer.

The gate electrode layer 26 and the gate dielectric layer 24 are patterned as shown in FIG. 3. The width of the gate electrode layer 26 is 0.5 micron or smaller. In some embodiments, the width may be no more than 0.3 micron.

Figure 4:
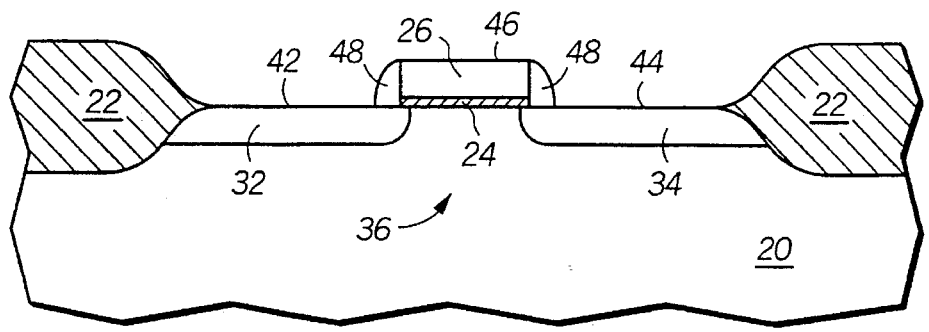
FIG. 4 includes an illustration of a cross-sectional view of the substrate of FIG. 3 after forming a source region, a drain region, and sidewall spacers.

A source region 32, a drain region 34, and sidewall spacers 48 are formed as shown in FIG. 4. The source region 32 and drain region 34 lie within the semiconductor substrate 20 and define a channel region 36 that lies between the source and drain regions and beneath the gate dielectric layer 24.

The spacers 48 are formed adjacent to the sides of the patterned gate dielectric and gate electrode layers 24 and 26, respectively. The spacers 48 include silicon dioxide, silicon nitride, silicon oxynitride, or any other insulating material. The spacers 48 are formed by depositing a conformal layer and anisotropically etching the layer. The thickness of the deposited layer is typically no more than 2000 Å. In one embodiment, the thickness is less than 1000 Å.

FIG. 4 also includes exposed surfaces 42, 44, and 46 of the source region 32, drain region 34 and gate electrode layer 26, respectively. The spacers 48 separate the exposed surfaces 42 and 44 from exposed surface 46. The lateral separation between the exposed surfaces generally corresponds to the thickness of the deposited layer from which the spacers 48 are formed. Therefore, the lateral separation between the exposed surfaces 42 and 46 and between exposed surfaces 44 and 46 is typically no more than 0.2 micron (2000 Å) and, in the one embodiment, is no more than 0.12 micron (1200 Å).

Figure 5:
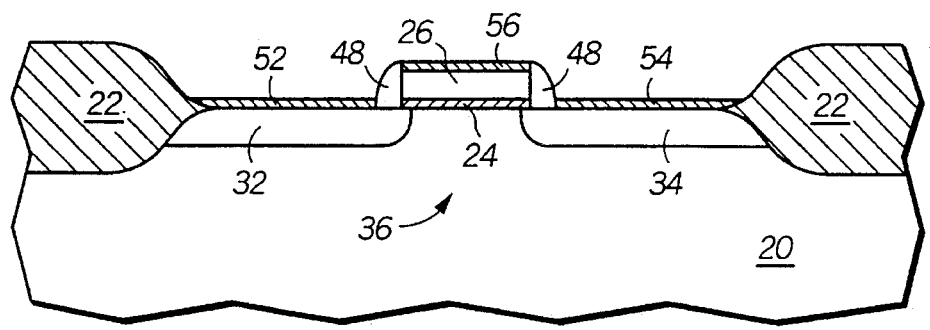
FIG. 5 includes an illustration of a cross-sectional view of the substrate of FIG. 4 after forming a compound including silicon and nitrogen from portions of the source and drain regions and gate electrode layer in accordance with one embodiment of the present invention.

The exposed surfaces 42, 44, and 46 are introduced to a nitrogen-containing material to form regions 52, 54, and 56 that have a compound including silicon and nitrogen as shown in FIG. 5. In one embodiment, regions 52, 54, and 56 are formed by a thermal reaction using an ambient including ammonia, nitric oxide, nitrous oxide, nitrogen, or the like at a temperature in a range of 700°–900° C. The regions 52, 54, and 56 have a thickness less than 50 angstroms (Å) and typically is about 20 Å, thick or less. The regions 52, 54, and 56 can also include some oxygen. The regions 52, 54, and 56 are formed in a rapid thermal processor, although a conventional diffusion furnace can be used. The formation of the compound within the regions is believed to be a function of time and temperature. If a conventional diffusion furnace is used for this step, the temperature is expected to be lower, and the time would be longer.

Figure 6:
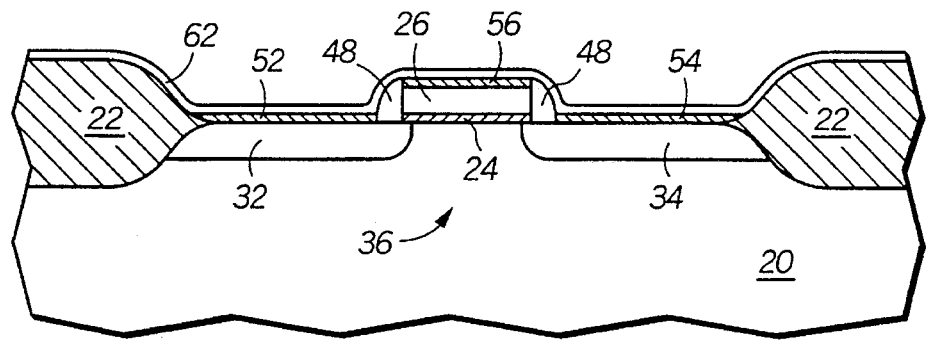
FIG. 6 includes an illustration of a cross-sectional view of the substrate of FIG. 5 after forming a titanium layer.

A titanium layer 62 is formed over the regions 52, 54, and 56 as well as other portions of the substrate 20 as shown in FIG. 6. The titanium layer 62 is formed by chemical vapor deposition, electron beam deposition, or sputter deposition. The thickness of the titanium layer 62 is typically no more than 1000 Å and in one embodiment is less than 500 Å. The titanium layer 62 does not include cobalt in this embodiment.

Figure 7:
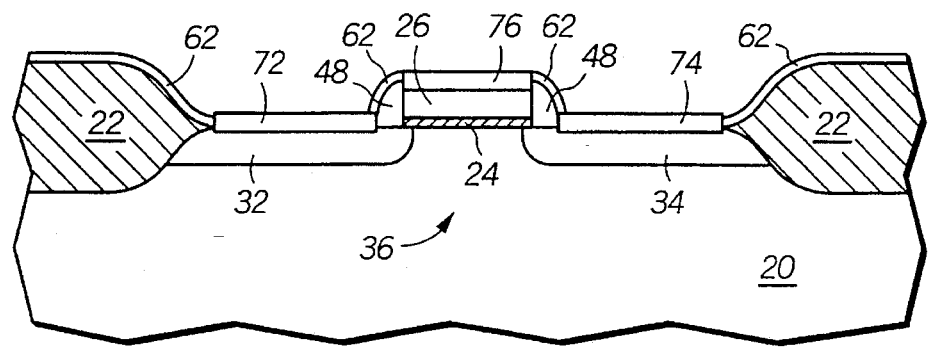
FIG. 7 includes an illustration of a cross-sectional view of the substrate of FIG. 6 after forming titanium disilicide regions over portions of the source and drain regions and the gate electrode layer in accordance with one embodiment of the present invention.

The substrate at this point in the process is heated in a rapid thermal processor at a temperature of at least 700° C. to form titanium disilicide regions 72, 74, and 76 that are in the C54 phase as shown in FIG. 7. The heating is performed in an ambient that includes argon, helium, nitrogen, ammonia, or the like. If the heating is performed using nitrogen or ammonia, a thin layer of titanium nitride forms near the exposed surface of the titanium layer 62 but is not shown in FIG. 7. Even if the titanium nitride is formed, most of the titanium layer 62 adjacent to the source region 32, drain region 34, and gate electrode layer 26 is reacted to form the titanium disilicide regions 72, 74, and 76.

In one embodiment, the reaction is performed at a temperature in a range of 800°–825° C. for a time in a range of 10–30 seconds. In this process the titanium disilicide regions 72, 74, and 76 have been formed in a single step reaction. No further thermal cycles are required to change the composition or phase of the material. This should be compared with a prior art process in which a first step is used to form titanium disilicide in the C49 phase and a second step is used to convert the C49 phase to the C54 phase.

Figure 8:
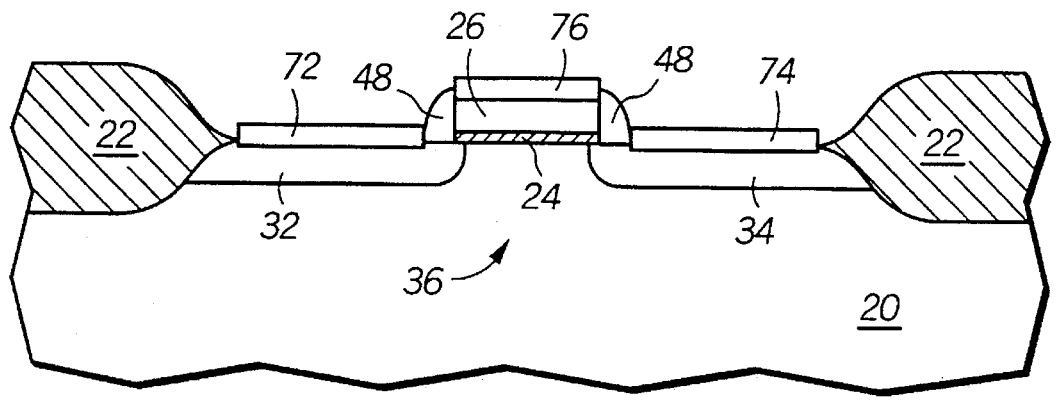
FIG. 8 includes a cross-sectional view of the substrate of FIG. 7 after removing unreacted portions of the titanium layer.

Unreacted portions of the titanium layer are removed using a solution including ammonium hydroxide and hydrogen peroxide as shown in FIG. 8. If a titanium nitride layer (not shown) is formed from a portion of the titanium layer 62, the titanium nitride layer is removed before removed the unreacted portions of the titanium layer. Regions 72, 74, and 76 have been formed using a self-aligned silicide (salicide) process. As can be seen in FIG. 8, there are no electrical shorts formed between the titanium disilicide region 76 and either of the titanium disilicide regions 72 and 74. The titanium disilicide regions 72, 74, and 76 may include small amounts of oxygen and nitrogen because the regions 52, 54, and 56 are consumed during the reaction to form the regions 72, 74, and 76. Because the regions 52, 54, and 56 are relatively thin, the amount of oxygen and nitrogen within the titanium disilicide regions 72, 74, and 76 should be relatively small and the resistance of these regions should be low.

Figure 9:
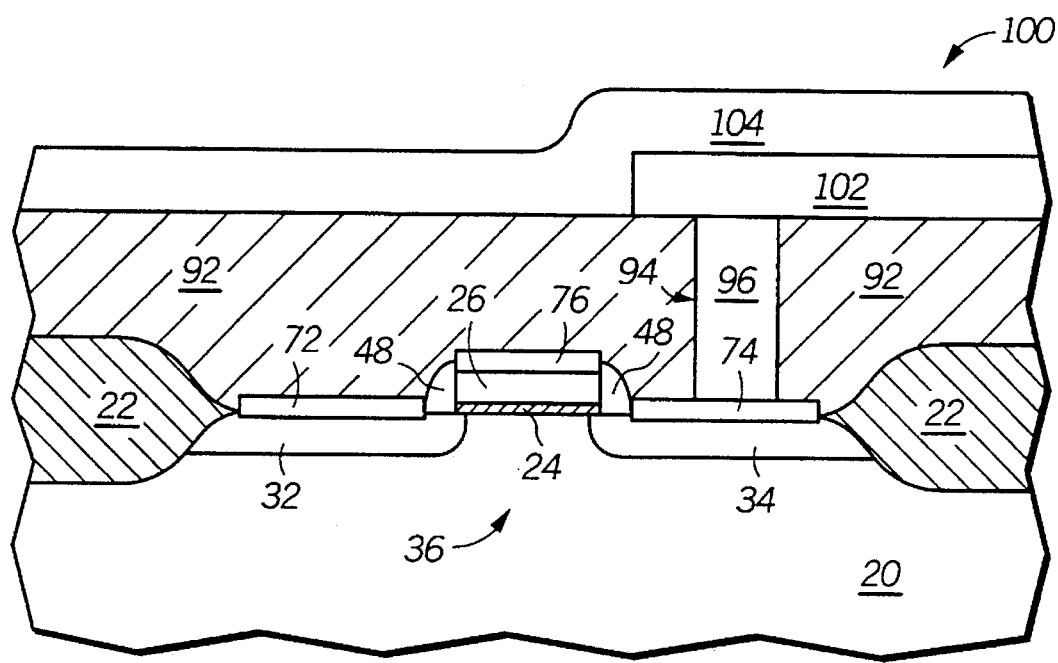
FIG. 9 includes an illustration of a cross-sectional view of the substrate of FIG. 8 after forming a substantially completed device.

The substrate is further processed to form a substantially completed device 100 as shown in FIG. 9. After the unreacted etch step, an interlevel dielectric layer 92 is formed over the substrate and is patterned to form a contact opening 94. The interlevel dielectric layer 92 include doped or undoped oxides. The contact opening 94 is formed down to the titanium disilicide region 74 and is filled with a conductive material to form a contact plug 96. An interconnect 102 is formed over the contact plug 96 and is covered by a passivation layer 104. Electrical connections to salicide regions 72 and 76 are made but are not shown in FIG. 9. Additional interlevel dielectric layers and interconnect levels may be formed if needed.

Alternate Embodiments

In another embodiment, the nitrogen is introduced near the surfaces of the source region 32, drain region 34, and gate electrode layer 26 by ion implanting nitrogen into the exposed surfaces. More specifically, the singly charged nitrogen ions having a mass of 28 atomic mass units (AMU) are implanted at an energy in a range of about 10–40 kiloelectron volts to a dose of at least 1E14 ions per square centimeter. In one particular embodiment, the implantation is performed at an energy of 25 kiloelectron volts to a dose of 1E15 ions per square centimeter. After forming the titanium layer, the substrate is subjected to the anneal as previously described. Silicon can react with the nitrogen from ion implantation or with the titanium to form titanium disilicide.

In another embodiment, the source region 32, drain region 34, and gate electrode layer 26 can be "amorphized" (break up the crystal or polycrystalline structure) by ion implantation before the reaction step. More specifically, ions include silicon, germanium, boron difluoride ($BF_2$), arsenic, or the like. At the same dose, heavier ions are more effective at amorphizing than lighter ions.

The species selected for the amorphizing implant depend on the type of device formed. Although an n-channel transistor is illustrated, the present invention can be used with a p-channel transistor, an npn bipolar transistor, a pnp bipolar transistor, or any combination of transistors. If only n-type regions are being implanted, the implanting species can be arsenic. If only p-type regions are being implanted, the implanting species can be boron difluoride. However, p-type and n-type ions should be avoided if n-type and p-type regions are implanted during the amorphizing implant. In this situation, silicon, germanium, or nitrogen ($N_2$) can be implanted. Silicon, germanium, or nitrogen ($N_2$) can also be used for implanting devices having only n-type or only p-type regions. Other than silicon and nitrogen, the amorphizing species typically has a mass of at least 48 AMU. These examples are not meant to limit the invention.

In yet another embodiment, two anneal steps can be used. After forming the titanium layer 62, the substrate is heated to a temperature in the range of 600°–650° C. to form titanium disilicide of the C49 phase. The second step is performed at a temperature of least 700° C. to convert the C49 phase to the C54 phase. Unreacted portions of the titanium layer 62 can be removed before or after the second step. Unlike the prior art, this embodiment should not be susceptible to agglomeration because nitrogen has been introduced into regions 52, 54, and 56 before the thermal steps to form titanium disilicide.

In yet another embodiment, other metals can be used to form metal semiconductor materials. These other metals can include titanium, tungsten, tantalum, molybdenum, nickel, or platinum. The embodiments of the present invention are particularly useful for layers in which reaction to a specific compound or phase is required but the chances of agglomeration or other undesired effects can occur.

Benefits

The embodiments described above are more resistant to thermal agglomeration during formation of a metal-semiconductor compound. In an embodiment of the present invention described above, the process forms a relatively uniform thickness of a titanium disilicide layer of the C54 phase that is not in the form of discrete islands. Therefore, compared to a thermally agglomerated titanium disilicide layer, embodiments of the present invention should form a semiconductor device having relatively low resistivity for source regions, drain regions, and gate electrodes; lower p-n junction leakage; and better gate dielectric integrity.

Another benefit of the present invention includes the formation of a titanium disilicide layer of the C54 phase in one step at a temperature of at least 700° C. Without an amorphizing implant, the one step formation can be formed at a temperature of at least 750° C. The step of introducing nitrogen into regions 52, 54, and 56 before the thermal step to form titanium disilicide in the C54 phase reduces the lo likelihood that a conductive titanium compound will form along the sides of the spacers 48. Therefore, a single thermal step can be used to form titanium silicide of the C54 phase with a reduced likelihood of forming a gate-to-source or gate-to-drain electrical short even when the lateral separation between exposed surfaces is less than 0.2 micron.

Yet another benefit of the present invention is its simplicity and ease of integration. The present invention has a step for introducing nitrogen that is as simple as a nitrogen implant or exposing a silicon surface to ammonia or some other nitrogen-containing gas for a relatively short amount of time. The temperature of this formation is going to be less than 900° C., and therefore, should not severely affect movement of doped regions within the substrate.

In the foregoing specification, the invention has been described with reference to specific embodiments thereof. However, it will be evident that various modifications and changes can be made thereto without departing from the scope of the invention as set forth in the appended claims. Accordingly, the specification and figures are to be regarded in an illustrative rather than a restrictive sense.

We claim:

1. A process for forming a semiconductor device comprising the steps of:

provifing a substrate having a first portion and a second portion, wherein the first and second portions:
include a semiconductor material; and
each have a surface and those surfaces are laterally separated from each other by no more than 0.2 microns;

introducing a nitrogen-containing material near the surfaces of the first and second portions;

forming a titanium layer over the first and second portions after the step of introducing; and reacting the titanium layer with the first and second portions to form a titanium-semiconductor material, wherein:
most of each of the first and second portions are covered by the titanium-semiconductor material;
the titanium-semiconductor material includes titanium, oxygen, and nitrogen;
this step is performed as a single step at a temperature of at least 700° C.; and
no other thermal step is performed to change a composition or phase of the titanium-semiconductor material; and removing unreacted portions of the titanium layer after the step of reacting, wherein the first and second portions are not electrically shorted to each other by the titanium-semiconductor material.

2. The process of claim 1, wherein the nitrogen-containing material includes a gas selected from a group consisting of ammonia, nitric oxide, nitrous oxide, and nitrogen.

3. The process of claim 1, wherein the step of introducing forms a compound including nitrogen and the semiconductor material.

4. The process of claim 1, wherein the step of introducing is performed while the first and second portions are at a temperature no higher than 900° C.

5. The process of claim 1, wherein the step of introducing is performed by implanting nitrogen into the first and second portions.

6. The process of claim 1, wherein the first portion is a gate electrode and the second portion is a doped region within a substrate.

7. The process of claim 6, wherein the gate electrode has a width no greater than 0.5 microns.

8. The process of claim 6, wherein the step of providing comprises steps of:

forming the first portion;.

forming a spacer adjacent to a side of the first portion; and forming the second portion adjacent to the spacer.

9. The process of claim 8, wherein the step of forming the spacer comprises steps of:

depositing a layer less than 1000 angstroms thick; and etching the layer to form the spacer.

10. The process of claim 1, further comprising a step of ion implanting ions before the step of reacting.

11. The process of claim 1, wherein the step of forming the titanium layer is performed such that the titanium layer has a thickness no greater than 1000 Å.

12. The process of claim 1, wherein the step of reacting forms titanium disilicide, wherein substantially all the titanium disilicide is in the C54 phase.

13. The process of claim 1, further comprising steps of:
  forming an interlevel dielectric layer over the titanium-semiconductor material after the step of removing, wherein the interlevel dielectric layer includes an opening; and
  forming a contact within an opening in the interlevel dielectric layer, wherein the contact lies within the opening and contacts the titanium-semiconductor material.

14. A process for forming a semiconductor device comprising the steps of:
  forming a gate electrode over a substrate, wherein the gate electrode has a surface and a width no greater than 0.5 microns;
  introducing a nitrogen-containing material near the surface of the gate electrode;
  forming a titanium layer over the gate electrode after the step of introducing;
  reacting the titanium layer with the gate electrode to form a titanium-silicon layer, wherein:
    the titanium-silicon layer includes titanium disilicide, oxygen, and nitrogen; and
  removing unreacted portions of the titanium layer after the step of reacting the titanium layer, wherein substantially all the gate electrode is covered by the titanium-silicon layer during this step.

15. The process of claim 14, wherein the nitrogen-containing material includes a gas selected from a group consisting of ammonia, nitric oxide, nitrous oxide, and nitrogen.

16. The process of claim 14, wherein the step of introducing forms a compound including nitrogen from portions of the gate electrode and doped region.

17. The process of claim 14, wherein the step of introducing is performed at a temperature no higher than 900° C.

18. The process of claim 14, further comprising a step of forming a spacer adjacent to a side of the gate electrode before the step of forming the titanium layer.

19. The process of claim 18, wherein the first doped region and the gate electrode are laterally separated by no more than 0.2 microns.

20. The process of claim 14, further comprising a step of ion implanting ions before the step of reacting.

21. The process of claim 14, wherein the step of forming the titanium layer is performed such that the titanium layer is deposited to a thickness less than 500 Å.

22. The process of claim 14, wherein:
  the process further comprises a step of first and second doped regions that lie on opposite sides of the gate electrode;
  the step of removing is performed such that the first doped region, the second doped region, and the gate electrode are not electrically short to one another; and
  the first doped region, the second doped region, and the gate electrode are parts of a same transistor.

23. The process of claim 22, wherein:
  the process further comprises steps of:
    forming a field isolation region before the step of forming the first and second doped regions; and
    forming a spacer adjacent to a side of the gate electrode before the step of forming the titanium layer;
  the step of forming the first and second doped regions is performed such that the first doped region lies adjacent to the field isolation region; and
  the step of removing is performed such that the titanium-silicon layer overlies all the first doped region except for portions of the first doped region covered by the field isolation region, the gate electrode and the spacer during the step of removing.

24. The process of claim 14, wherein the step of reacting is performed:
  as a single step at a temperature of at least 700° C.; and
  such that substantially all the titanium disilicide in the titanium-silicon layer is in the C54 phase.

25. The process of claim 24, wherein the step of reacting is performed at a temperature of at least 750° C.

26. The process of claim 14, wherein:
  the step of reacting forms titanium disilicide in the C49 phase; and
  the process further includes a step of heating the titanium-silicon layer after the step of removing such that substantially all titanium disilicide is in the C54 phase.

27. The process of claim 14, wherein the step of introducing is performed by implanting nitrogen into the gate electrode.

28. The process of claim 14, further comprising steps of:
  forming an interlevel dielectric layer over the titanium-silicon layer after the step of removing, wherein the interlevel dielectric layer includes an opening; and
  forming a contact within an opening in the interlevel dielectric layer, wherein the contact lies within the opening and contacts the titanium-silicon layer.

* * * * *